United States Patent [19]
Harkness et al.

[11] Patent Number: 5,861,235
[45] Date of Patent: Jan. 19, 1999

[54] ULTRAVIOLET-CURABLE COMPOSITION AND METHOD FOR PATTERNING THE CURED PRODUCT THEREFROM

[75] Inventors: Brian R. Harkness, Vale of Glamorgan, United Kingdom; Mamoru Tachikawa; Kasumi Takei, both of Kanagawa, Japan

[73] Assignee: Dow Corning Asia, Ltd., Tokyo, Japan

[21] Appl. No.: 881,167

[22] Filed: Jun. 24, 1997

[30] Foreign Application Priority Data

Jun. 26, 1996 [JP] Japan .................................. 8-165950

[51] Int. Cl.$^6$ ................................ G03C 5/00; C08F 2/46
[52] U.S. Cl. ........................ 430/325; 430/270.1; 430/330; 430/919; 430/286.1; 522/63; 522/99; 522/148
[58] Field of Search .................................. 522/99, 36, 65, 522/63, 50, 148; 430/325, 920, 919, 330, 286.1

[56] References Cited

U.S. PATENT DOCUMENTS

| | | | |
|---|---|---|---|
| 5,591,783 | 1/1997 | Kobayashi et al. | 522/31 |
| 5,595,856 | 1/1997 | Mochizuki et al. | 430/270.1 |
| 5,616,629 | 4/1997 | Nguyen et al. | 522/40 |

FOREIGN PATENT DOCUMENTS

| | | | |
|---|---|---|---|
| 0 725 106 A2 | 8/1996 | European Pat. Off. | C08K 5/16 |
| 06 148 887 A | 5/1994 | Japan . | |
| 6-148887 | 5/1994 | Japan . | |
| 6-148895 | 5/1994 | Japan . | |
| 6-080879 | 8/1994 | Japan . | |
| 6-273936 | 9/1994 | Japan . | |

OTHER PUBLICATIONS

Jpn. J. Appl. Phys., vol. 32 (1993) pp. 6052–6058, Ito et al. Part I, No. 12B, Dec. 1993.

*Primary Examiner*—Janet Baxter
*Assistant Examiner*—Rosemary Ashton
*Attorney, Agent, or Firm*—Sharon K. Severance

[57] ABSTRACT

This invention pertains to a curable composition comprising a N-substituted 4-(o-nitrophenyl)dihydropyridine (a compound that generates base under the action of ultraviolet radiation) and a silanol-containing polymer that condenses under the action of the base generated to form a siloxane bond. The compositions of the instant invention cure by exposure to ultraviolet radiation. Cured patterns may be formed from the curable composition by interposing a mask between a film of the said composition and the radiation source during UV exposure, then dissolving and removing the uncured composition to form a pattern, and thereafter heating the residual material. The compositions can be cured by low-strength ultraviolet radiation and produce a highly heat-resistant cured product.

12 Claims, No Drawings

ULTRAVIOLET-CURABLE COMPOSITION AND METHOD FOR PATTERNING THE CURED PRODUCT THEREFROM

BACKGROUND OF THE INVENTION

This invention relates to an ultraviolet-curing silicon-containing resin composition that can be used to fabricate dielectric films in semiconductor devices, to a method for curing said composition, and to a patterning method using said composition.

It is well known that hydroxyl groups directly bonded to silicon (silanol) can be easily condensed in the presence of acid or base to form siloxane bonds (*Chemistry and Technology of Silicones*, pp. 211–216).

One method for curing siloxane polymers employs an acid generator, that is, a compound that generates acid upon exposure to ultraviolet radiation ("UV acid generator"). Silanol condensation is catalyzed by the generated acid and the siloxane polymer undergoes curing as a result. Japanese Patent Application Laid Open [Kokai or Unexamined] Number Hei 6-80879 [80,879/1994] and Jpn. J. Appl. Phys., Vol. 32 (1993), pp. 6052–6058, teach the fabrication of silicate glass thin films using the combination of a UV acid generator and special siloxane.

Another technology recently under active investigation attempts to use a compound that generates a base upon exposure to UV radiation ("UV base generator"), to accelerate silanol condensation and thereby effect the curing reaction.

Japanese Patent Application Laid Open [Kokai] Number Hei 6-148887 [148,887/1994]), discloses the cure of a composition comprising poly(silsesquioxane) or poly(silsesquioxane) and tetraphenoxysilane. In the first example of JP'887 the sensitivity (D50=radiation dose at which 50% of the film remains after development) is 25 mJ/cm$^2$ for the polysilsesquioxane curing reaction by a photogenerated amine compound and is 60 mJ/cm$^2$ even when the tetrafunctional silane monomer has been added to the system (all values measured at 254 nm).

Japanese Patent Application Laid Open [Kokai] Number Hei 6-273936 [273,936/1994]) discloses a curable composition comprising siloxane polymer and a base generator. JP'936 does not report sensitivity (D50) values, but does report 100 to 300 mJ/cm$^2$ (365 nm) as the dose required for curing.

Japanese Patent Application Laid Open [Kokai] Number Hei 6-148895 [148,895/1994]) discloses the use of alkali-soluble siloxane polymer and a photobase generator. JP'895 reports a cure catalyzed by the organic amine generated by the decomposition of organic carbamate by from 600 to 1,500 mJ/cm$^2$ UV radiation (365 nm).

Cured regions in which crosslinking has been induced by the above-described methods as a general rule have a substantially lower solvent solubility than the uncured regions, and the exploitation of this feature makes imaging possible.

The methods for curing siloxane polymer using a UV base generator can suffer from the following problems:

(1) long UV exposure times can be required due to a low sensitivity by the photobase generator;

(2) the low catalytic activity of the generated base in the curing reaction can lead to a very poor cure in many silanol-functional silicone resins, or, when this is not the case, a lengthy post-bake at high temperatures can be required.

It is therefore an object of the instant invention to provide a UV-curable composition that can be cured by low-strength UV radiation while using mild post-bake conditions.

It is further an object of the instant invention to provide a method for curing the said composition and a patterning method that uses said composition.

SUMMARY OF THE INVENTION

This invention pertains to a curable composition that contains a compound that generates base under the effect of UV radiation ("UV base generator") and a polymer having silicon-bonded hydroxyl (silanol) that readily condenses under the action of the said base. This composition is cured by exposure to UV radiation to generate a basic compound followed by holding at ambient temperature when the silanol condensation reaction is sufficiently rapid or, when such is not the case, heating at a suitably high temperature in order to accelerate the condensation reaction. This invention also pertains to a method of making patterned coatings from the composition comprising the UV base generator and silanol functional polymer.

THE INVENTION

This invention pertains to a curable composition that contains a compound that generates base under the effect of UV radiation ("UV base generator") and a polymer having silicon-bonded hydroxyl (silanol) that readily condenses under the action of the base.

The UV base generator is a 4-(o-nitrophenyl) dihydropyridine. The UV base generator may be exemplified by 4-(o-nitrophenyl)dihydropyridines in which position 1 of the dihydropyridine moiety is substituted by alkyl, alkenyl, or aralkyl. When such factors as ease of synthesis and handling and good photodegradability are considered, the optimal 4-(o-nitrophenyl)dihydropyridines are selected from 4-(o-nitrophenyl)dihydropyridines in which the group bonded at position 1 on the dihydropyridine is selected from methyl, ethyl, n-propyl, n-butyl, allyl, 3-butenyl, or benzyl; the group bonded at position 3 and position 5 on the dihydropyridine is methoxycarbonyl or ethoxycarbonyl; and the group bonded at position 2 and position 6 on the dihydropyridine is selected from methyl or ethyl.

Since the base generated upon UV irradiation exercises a catalytic activity in the condensation reaction of the silanol group (OH), the base generator is added in catalytic quantities relative to the silanol in the composition. However, the addition of too little leads to diminished curing reaction rates, while the addition of too much can lead to fragile physical properties on the part of the composition prior to its cure and can adversely affect the physical properties of the cured composition. Taking into account the cure rate as well as the physical properties of the curable composition and the cured product therefrom, the content of the base generator should be from 0.01 to 20 wt % and preferably is from 0.1 to 10 wt %, relative to the total weight of the curable composition.

The silanol-functional polymer useful in the instant invention may be represented by the general formula

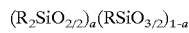

wherein each R is a monoradical independently selected from the group consisting of $C_1$ to $C_8$ saturated and unsaturated hydrocarbyl groups that optionally contain at least one atom selected from oxygen, nitrogen, chlorine, silicon, and fluorine and $0.5 \geq a \geq 0$.

At least one of the divalent oxygen atoms bonded to silicon in each $R_2SiO_{2/2}$ and $RSiO_{3/2}$ is bonded to another silicon to form a siloxane bond while the remaining oxygen may be bonded to another silicon to form a siloxane bond, or may be bonded to hydrogen to form silanol, or may be bonded to $C_1$–$C_2$ alkyl to form alkoxy. However, at least 10 mole % of the total $RSiO_{3/2}$ must be $RSiO_{3/2}$ having at least one silanol.

The $R_2Si$ in $R_2SiO_{2/2}$ may be exemplified by dimethylsilylene, methylphenylsilylene, methylvinylsilylene, methyl(1,1,1-trifluoropropyl)silylene, diphenylsilylene, and phenylvinylsilylene.

The R in $RSiO_{3/2}$ may be exemplified by methyl, vinyl, ethyl, allyl, propyl, butyl, hexyl, octyl, trifluoropropyl, trimethylsilylmethyl, phenyl, p-tolyl, m-tolyl, and 4-vinylphenyl.

The silanol-functional polymer may be represented by (R2SiO$_{2/2}$) (RSiO$_{3/2}$) ("DT" resins) and by $RSiO_{3/2}$ ("polysilsesquioxane-type" resins). Typical DT resins may prepared by cohydrolysis of dimethyldichlorosilane and methyltrichlorosilane; by cohydrolysis of dimethyldichlorosilane and phenyltrichlorosilane; by cohydrolysis of diphenyldichlorosilane and methyltrichlorosilane; by cohydrolysis of diphenyldichlorosilane and phenyltrichlorosilane; by condensation and hydrolysis of diphenylsilanediol and methyltrichlorosilane; by condensation and hydrolysis of diphenylsilanediol and phenyltrichlorosilane; and by hydrolysis of diphenylsilanediol and methyltrimethoxysilane.

The polysilsesquioxane-type resins may be exemplified by resins prepared by hydrolysis of phenyltrichlorosilane; by hydrolysis of methyltrichlorosilane or methyltrimethoxysilane.

When the silanol-functional polymer has the formula $RSiO_{3/2}$ (a=0) and the organic substituent on silicon is straight-chain hydrocarbyl there must be at least 10 moles and more preferably on at least 13 mole % hydroxyl directly bonded to silicon (the silanol group) based on all the silicon atoms in the polymer molecule. Similarly, when subscript a is equal to zero and the organic substituent on silicon is a branched hydrocarbyl there must be at least 10 mole %, preferably at least 20 mole %, and more preferably at least 40 mole % hydroxyl directly bonded to silicon (the silanol group) based on all of the silicon atoms. When subscript a is not zero, the silanol-functional ($RSiO_{3/2}$) in the polymer molecule should account for at least 10 mole % of the total silicon.

In order to obtain faster curing and produce a high-hardness cured product, the silanol-functional ($RSiO_{3/2}$) preferably accounts for at least 15 mole % of the total silicon, and in particular, when the R in the ($RSiO_{3/2}$) unit is a branched hydrocarbyl such as isopropyl, cyclohexyl, or phenyl should account for at least 30 mole % of the total silicon The silanol functional polymer may be further exemplified by
(i) polysilsesquioxanes composed of only ($RSiO_{3/2}$) wherein R is selected from methyl, ethyl, propyl, 3,3,3-trifluoropropyl, n-butyl, n-hexyl, n-octyl, vinyl, allyl, and 5-hexenyl; and $RSiO_{3/2}$ having at least one silanol accounts for at least 10 mole % of the total silicon in the polymer molecule;
(ii) polymer molecules composed of only ($RSiO_{3/2}$) wherein R is selected from isopropyl, phenyl, m-tolyl, and p-tolyl; and $RSiO_{3/2}$ having at least one silanol accounts for at least 40 mole % of the total silicon in the polymer molecule; and
(iii) polymer molecules expressed by $(R_2SiO_{2/2})_a(RSiO_{3/2})_{1-a}$ wherein a is a number with a value from 0.2 (inclusive) to 0.5 (inclusive), the groups R in $R_2SiO_{2/2}$ are independently selected from phenyl and methyl, the R in $RSiO_{3/2}$ is selected from methyl and phenyl; and $RSiO_{3/2}$ having at least one silanol accounts for at least 15 mole % of the total silicon in the polymer molecule.

The ease of cure of the silanol-functional polymer is related to the quantity and nature of the silanol in the polymer molecule. For example, $RSiO_{3/2}$ bearing a phenyl or isopropyl substituent, substantial steric hindrance by the organic substituent on the silicon impairs the capacity of silanol groups to approach each other and thereby impairs the condensation reaction. When this situation prevails, $RSiO_{3/2}$ bearing at least one silanol must be present in high concentrations. As may in contrast be seen for $RSiO_{3/2}$ bearing a methyl or allyl substituent, low steric hindrance by the organic substituent on the silicon facilitates the approach of silanol groups to each other and thereby facilitates the condensation reaction. A satisfactory cure will develop in this case even when such groups are present in low concentrations.

The compositions of the instant invention are cured by exposing the curable composition to ultraviolet radiation at 0° C. to 100° C. and then as necessary holding for up to 5 hours at 0° C. to 400° C. in order thereby to effect a cure of the curable composition by condensation of the hydroxyl (OH) in the curable composition under catalysis by the basic compound produced in those regions subject to ultraviolet exposure. The UV exposure time is not critical, but in order to efficiently utilize the base generator, UV exposure is preferably carried out for enough time to decompose a relatively large fraction of the base generator, i.e., from 10% to 100%, into the basic compound catalyst.

This invention also pertains to a method for forming a cured pattern by interposing a masking pattern (mask) between the curable composition and UV source during UV exposure in the curing method and after UV exposure and post-treatment, dissolving and removing (development) the uncured curable composition using inorganic or organic solvent.

The cured pattern is generally produced by coating a solution of the curable composition on a substrate using a procedure such as spin coating, casting, or painting; removing all or part of the solvent; placing a photomask that intercepts UV radiation between the coated composition and the UV source; exposing; and immediately thereafter, or after a post-treatment for the purpose of accelerating the curing reaction, washing the substrate with an inorganic or organic solvent in order to remove the uncured regions and thereby generate a pattern of the cured product. Alternatively, after the developing solvent has been dried off, heating can be carried out at from 50° C. to 400° C. in order to induce additional curing in the patterned cured product.

Optimal curing conditions cannot be specified because factors such as the type, molecular weight, molecular weight distribution, and softening point of resin; type and quantity of addition of the UV base generator; type, exposure time, and intensity of UV radiation; temperature and humidity during UV exposure; and post-reaction conditions (i.e., reaction temperature, humidity during the post-reaction interval, post-reaction time, etc.), are interrelated. However, the temperature during UV exposure and during the post-reaction period must be lower than the softening point of the resin and the thermal decomposition temperature of the UV base generator. Moreover, the reactivity of the silanol groups must be high enough that the crosslinking reaction will proceed sufficiently faster than diffusion of the base generated by UV exposure.

Insofar as the essential features of the present invention are not impaired, a third component may be added to the curable composition in addition to UV base generator, and crosslinker. In particular, a component can be added that functions as a catalyst of crosslinking reactions within the resin during heating. Such a component is added for the purpose of additionally accelerating cure in the residual negative regions after patterning by UV exposure and development. Components of this type are exemplified by radical initiators that accelerate cure through radical reactions (e.g., peroxides, azo compounds, and others) and by transition metal catalysts that at elevated temperature manifest catalytic activity in the hydrosilylation reaction. Additionally, organic and inorganic components having special functionalities or physical properties can be dissolved or dispersed in the curable composition for the purpose of thereby producing a cured product or cured pattern endowed with particular desired functionalities or physical properties.

The composition of the instant invention is a photocurable composition that has an excellent UV photocurability and an excellent UV photopatternability. This technology is capable of reproducing the fine patterns on a mask. Moreover, post-curing reactions convert the resulting pattern into a cured silicone film that exhibits excellent insulating properties, an excellent heat resistance, and an excellent resistance to oxygen plasmas.

So that those skilled in the art can understand and appreciate the invention taught herein, the following examples are presented, it being understood that these examples should not be used to limit the scope of this invention found in the claims.

In the following examples, $^{29}$Si{1H}-NMR refers to $^{29}$Si nuclear magnetic resonance spectroscopy (proton decoupled); CDCl$_3$ refers to deuterochloroform; the functional group within parentheses in the nuclear magnetic resonance spectral data refers to the assignment for the particular signal; and the chemical shift in the $^{29}$Si-NMR spectra is the value obtained using 0 ppm for the chemical shift of the silicon in a tetramethylsilane external standard (CDCl$_3$ solution). GPC refers to gel permeation chromatography. This measurement was run using an HLC-8020 from Tosoh Kabushiki Kaisha.

The UV exposure experiments were run using a UIS-500C Lamphouse from Ushio Denki Kabushiki Kaisha (500-W mercury-xenon lamp) and a "Kin'itsu-kun" uniform UV irradiator (200-W mercury-xenon lamp) from Yamashita Denso Kabushiki Kaisha.

PREPARATION EXAMPLE 1

Synthesis of poly(allylsilsesquioxane) resin

Poly(allylsilsesquioxane) resin was synthesized from allyltrichlorosilane using the method described in U.S. Pat. No. 4,826,943.

Infrared absorption: 3000~3600 cm$^{-1}$ (SiOH), 1620 cm$^{-1}$ (allyl), 1380 cm$^{-1}$ (Si-allyl), 1030 cm$^{-1}$, 1090 cm$^{-1}$ (Si—O)

$^{29}$Si-NMR (relative intensity, functional group): −58~−65 ppm (0.14, CH$_2$=CHCH$_2$SiO (OH)), −67~−78 ppm (0.86, CH$_2$=CHCH$_2$SiO$_{3/2}$) (These analytical results confirmed that silanol-functional CH$_2$=CHCH$_2$SiO$_{3/2}$ accounted for 14 mole % of the total silicon in the polymer molecule)

GPC (polystyrene calibration): Mn=2300, Mw=17000

PREPARATION EXAMPLE 2

Synthesis of diphenylsiloxane-methylsilsesquioxane copolymer under weakly acidic conditions 10.09 g methyltrichlorosilane was placed in a 300-mL three-neck flask that had been filled with nitrogen and was cooled to 0° C. To this was added 10.95 g diphenylsilanediol dissolved in 8.0 g pyridine over 20 minutes with vigorous stirring. The reaction was then warmed to room temperature while stirring, 60 mL ether was added, and stirring was continued for another 30 minutes. The precipitate was filtered off to give an ether solution of polysiloxane. This ethereal polysiloxane solution was then added dropwise over 10 minutes to a stirred solution of 11 g sodium bicarbonate in 14 g water. The organic layer was then separated off and dried over anhydrous sodium sulfate. Subsequent removal of the solvent gave 10.4 g resin.

Infrared absorption: 3000~3600 cm$^{-1}$ (SiOH), 1429 cm$^{-1}$, 1271 cm$^{-1}$, 1128 cm$^{-1}$ (Si—Ph), 1086 cm$^{-1}$, 1037 cm$^{-1}$ (Si—O)

$^1$H-NMR (relative intensity, functional group): −0.2~0.2 (0.25, methyl), 2.5~5.0 (0.07, silanol), 6.9~7.8 (0.68, phenyl)

$^{29}$Si-NMR (relative intensity, functional group): −35~−46 ppm (0.43, Ph$_2$SiO), −46~−58 ppm (0.45, MeSiO(OH)), −63~−67 ppm (0.12, MeSiO$_{3/2}$) (These analytical results confirmed that silanol-functional CH$_3$SiO$_{3/2}$ accounted for 45 mole % of the total silicon in the polymer molecule.)

GPC (polystyrene calibration): Mn=108, Mw=1400

PREPARATION EXAMPLE 3

Synthesis of diphenylsiloxane-methylsilsesquioxane copolymer under strongly acidic conditions 42.7 g methyltrichlorosilane was placed in a 500-mL three-neck flask that had been filled with nitrogen and was cooled to 0° C. To this was added 46.4 g diphenylsilanediol dissolved in 37.4 g pyridine over 10 minutes with vigorous stirring. The reaction was then warmed to room temperature while stirring and stirring was continued for another 1 hour. 93 mL toluene was added to the solution followed by the addition of 200 mL water with vigorous stirring and then stirring for another 30 minutes. 200 mL ether was added to the reaction and the organic layer was washed several times with water. This was followed by the addition of hexane, filtration, and removal of the solvent at room temperature to give 54.7 g resin. This resin was dissolved in toluene (20% solution) and heated under reflux for 12 hours and the resulting solution was used for subsequent reaction.

Infrared absorption: 3000~3600 cm$^{-1}$ (SiOH), 1127 cm$^{-1}$ (Si—Ph), 1030 cm$^{-1}$, 1090 cm$^{-1}$ (Si—O)

$^{29}$Si-NMR (CDCl$_3$): −35~−47 ppm (0.49, Ph$_2$SiO), −50~−60 ppm (0.07, MeSiO(OH)), −60~−70 ppm (0.45, MeSiO$_{3/2}$) (These analytical results confirmed that silanol-functional CH$_3$SiO$_{3/2}$ accounted for 7 mole % of the total silicon in the polymer molecule.)

GPC (polystyrene calibration): Mw=27000

PREPARATION EXAMPLE 4

Poly(methylsilsesquioxane)

Poly(methylsilsesquioxane) was prepared by the hydrolysis and condensation of methyltrimethoxysilane using hydrochloric acid according to a method described in the literature (see S. Nakahama, et al., Contemp. Top. Polym. Sci., 1984, Volume 4, p. 105 and Y. Abe, et al., J. Polym. Sci. Part A Polym. Chem., 1995, Volume 33, page 751). The $^{29}$Si-NMR spectrum confirmed that silanol-functional CH$_3$SiO$_{3/2}$ accounted for 22 mole % of the total silicon in the polymer molecule.

Results of GPC analysis: Mw=2150, Mn=660

PREPARATION EXAMPLE 5
Methylsilsesquioxane-dimethylsiloxane-phenylsilsesquioxane copolymer 5 mL water was added dropwise over 30 minutes with vigorous stirring to a mixture of methyltrichlorosilane (5.0 g), dimethyldichlorosilane (3.6 g), phenyltrichlorosilane (8.2 g), and toluene (50 mL). This was followed by stirring for another 30 minutes at room temperature, the addition of 100 mL toluene, and washing with deionized water 4 times. Anhydrous sodium sulfate was added to the organic layer, which was then held overnight. Filtration and removal of the solvent under reduced pressure then gave 9.2 g of a white solid.

GPC: Mn=1000

$T(Me)_{26}D(Me,OH)_7D(Me_2)_{28}T(Ph)_{27}D(Ph,OH)_{11}$ according to the silicon-29 NMR spectrum. Therefore, according to the $^{29}Si$ NMR spectrum, silanol-functional $CH_3SiO_{3/2}$ and $PhSiO_{3/2}$ accounted for 18 mole % of the total silicon in the polymer molecule (Ph=phenyl).

PREPARATION EXAMPLE 6
Synthesis of silanol-rich phenylsilsesquioxane polymer 7 mL water dissolved in 40 mL dioxane was added dropwise over 30 minutes to a vigorously stirred mixture of phenyltrichlorosilane (27 g) and dioxane (80 mL). After stirring for an additional 1 hour at room temperature, the volatiles were removed by heating to 70° C. in a vacuum. 100 mL toluene was added to the residue followed by washing 4 times with deionized water. Anhydrous sodium sulfate was added to the organic layer, which was then held overnight. Filtration and removal of the solvent under reduced pressure then gave 15.5 g of a white solid.

GPC: Mn=500

Silanol-functional $PhSiO_{3/2}$ accounted for 62 mole % of the total silicon in the polymer molecule by $^{29}Si$-NMR (Ph=phenyl).

PREPARATION EXAMPLE 7
Synthesis of UV base generator 100 mL toluene, 10 g 2-nitrobenzyl alcohol, and 11.4 g octyl isocyanate were placed in a 200-mL roundbottom flask, heated at reflux under nitrogen for 2 hours, and then cooled. The reaction solution was washed with water several times and the resulting toluene solution was then dried over sodium sulfate. The sodium sulfate was filtered off and the solvent was removed from the filtrate on a rotary evaporator. The resulting solid was recrystallized twice from hexane, yielding 12.5 g o-nitrobenzyl n-octylcarbamate as light yellow needle-like crystals.

Melting point=70° C.–71° C.

Infrared absorption: 3331 $cm^{-1}$, 1691 $cm^{-1}$

PREPARATION EXAMPLE 8
Synthesis of UV base generator 12 g nifedipine was placed in a 100-mL three-neck flask and dissolved in 50 mL tetrahydrofuran under nitrogen. To this was added 1.66 g of an oil dispersion of sodium hydride (60% NaH) with stirring. After stirring for a brief period of time, 10 mL methyl iodide was added and the reaction was stirred for 1 hour at 38° C. 200 mL ethyl acetate was then added and the organic layer was washed several times with water and dried over sodium sulfate. The sodium sulfate was filtered off and the solvent was removed from the filtrate on a rotary evaporator. The resulting solid was dissolved in 200 mL MIBK. The addition of hexane gave 8.9 g N-methylnifedipine as yellow crystals.

Melting point=184° C.–187° C.

Infrared absorption spectrum: 1690 $cm^{-1}$ (C=O), 1524 $cm^{-1}$ (N—O)

Proton-NMR spectrum (solvent: $CDCl_3$): 2.5 (6H, methyl), 3.3 (3H, N-methyl), 3.6 (6H, O-methyl), 5.7 (1H, C—H), 7.2–7.6 (4H, aromatic C—H)

EXAMPLE 1
Photocure of poly(allylsilsesquioxane)

1 wt % (based on resin) of the N-methylnifedipine base generator prepared in Preparation Example 8 was added to the poly(allylsilsesquioxane) prepared in Preparation Example 1, and the resulting mixture was dissolved in methyl isobutyl ketone to prepare the 25 wt % solution. This solution was filtered through a filter with a pore size of 0.45 micron, spin coated on a silicon wafer, and pre-baked at 80° C. for 1 minute. The coating thickness was 1 micron. A photomask was overlaid followed by UV irradiation from the 200-W mercury-xenon lamp for 10 seconds. The silicon wafer was then post-baked at 150° C. for 3 minutes, washed with methyl isobutyl ketone, and dried, with the result that a resin pattern corresponding to a negative of the photomask was obtained. The unexposed regions were entirely free of residual resin. It was determined that a resolution of 6.3 microns had been obtained.

COMPARATIVE EXAMPLE 1
Photocure of poly(allylsilsesquioxane)

10 wt % (based on resin) of the n-octylcarbamate base generator prepared in Preparation Example 7 was added to the poly(allylsilsesquioxane) prepared in Preparation Example 1, and this mixture was dissolved in methyl isobutyl ketone to prepare the 25 wt % solution. This solution was then filtered through a filter with a pore size of 0.45 micron, spin coated on a silicon wafer, and pre-baked at 80° C. for 1 minute. The coating thickness was 1 micron. A photomask was overlaid followed by UV irradiation from the 200-W mercury-xenon lamp for 10 seconds. The silicon wafer was post-baked at 150° C. for 3 minutes. The resin was dissolved out and removed upon washing with methyl isobutyl ketone and drying, and a resin pattern corresponding to a negative of the photomask was not obtained.

EXAMPLE 2
Photocure of diphenylsiloxane-methylsilsesquioxane copolymer 1 wt % (based on resin) of the N-methylnifedipine base generator prepared in Preparation Example 8 was added to the diphenylsiloxane-methylsilsesquioxane copolymer prepared in Preparation Example 2, and the resulting mixture was dissolved in methyl isobutyl ketone to prepare the 25 wt % solution. This solution was filtered through a filter with a pore size of 0.45 micron, spin coated on a silicon wafer, and pre-baked at 80° C. for 1 minute. The coating thickness was 1 micron. A photomask was overlaid followed by UV irradiation from the 200-W mercury-xenon lamp for 5 seconds. The silicon wafer was then post-baked at 100° C. for 7 minutes, washed with methyl isobutyl ketone, and dried, with the result that a resin pattern corresponding to a negative of the photomask was obtained. The unexposed regions were entirely free of residual resin. It was determined that a resolution of 20 microns had been obtained.

COMPARATIVE EXAMPLE 2
Photocure of diphenylsiloxane-methylsilsesquioxane copolymer 10 wt % (based on resin) of the n-octylcarbamate base generator prepared in Preparation Example 7 was added to the diphenylsiloxane-methylsilsesquioxane copolymer prepared in Preparation Example 2, and this mixture was dissolved in methyl isobutyl ketone to prepare the 25 wt % solution. This solution was then filtered through a filter with a pore size of 0.45 micrometer, spin coated on a silicon wafer, and pre-baked at 80° C. for 1 minute. The coating thickness was 1 micron. A photomask was overlaid followed by UV irradiation from the 200-W mercury-xenon lamp for 5 seconds. The silicon wafer was post-baked at 100° C. for 7 minutes. The resin was dissolved out and removed upon washing with methyl isobutyl ketone and drying, and a resin pattern corresponding to a negative of the photomask was not obtained.

COMPARATIVE EXAMPLE 3
Photocure of diphenylsiloxane-methylsilsesquioxane copolymer 1 wt % (based on resin) of the N-methylnifedipine base generator prepared in Preparation Example 8 was added to the low-silanol diphenylsiloxane-methylsilsesquioxane copolymer prepared in Preparation Example 3, and this mixture was dissolved in methyl isobutyl ketone to prepare the 25 wt % solution. This solution was then filtered through a filter with a pore size of 0.45 micrometer, spin coated on a silicon wafer, and pre-baked at 80° C. for 1 minute. The coating thickness was 1 micron. A photomask was overlaid followed by UV irradiation from the 200-W mercury-xenon lamp for 5 seconds. The silicon wafer was post-baked at 100° C. for 7 minutes. The resin was dissolved out and removed upon washing with methyl isobutyl ketone and drying, and a resin pattern corresponding to a negative of the photomask was not obtained.

EXAMPLE 3
Photocure of poly(methylsilsesquioxane)

1 wt % (based on resin) of the N-methylnifedipine base generator prepared in Preparation Example 8 was added to the poly(methylsilsesquioxane) prepared in Preparation Example 4, and the resulting mixture was dissolved in methyl isobutyl ketone to prepare the 25 wt % solution. This solution was filtered through a filter with a pore size of 0.45 micrometer, spin coated on a silicon wafer, and pre-baked at 80° C. for 1 minute. The coating thickness was 1 micron. A photomask was overlaid followed by UV irradiation from the 200-W mercury-xenon lamp for 3 seconds. The silicon wafer was then post-baked at 100° C. for 3 minutes, washed with methyl isobutyl ketone, and dried, with the result that a resin pattern corresponding to a negative of the photomask was obtained. The unexposed regions were entirely free of residual resin. It was determined that a resolution of 4 microns had been obtained.

COMPARATIVE EXAMPLE 4
Photocure of poly(methylsilsesquioxane)

10 wt % (based on resin) of the n-octylcarbamate base generator prepared in Preparation Example 7 was added to the poly(methylsilsesquioxane) prepared in Preparation Example 4, and this mixture was dissolved in methyl isobutyl ketone to prepare the 25 wt % solution. This solution was then filtered through a filter with a pore size of 0.45 micrometer, spin coated on a silicon wafer, and pre-baked at 80° C. for 1 minute. The coating thickness was 1 micron. A photomask was overlaid followed by UV irradiation from the 200-W mercury-xenon lamp for 3 seconds. The silicon wafer was post-baked at 100° C. for 3 minutes. The resin was dissolved out and removed upon washing with methyl isobutyl ketone and drying, and a resin pattern corresponding to a negative of the photomask was not obtained.

EXAMPLE 4
Photocure of methylsilsesquioxane-dimethylsiloxane-phenylsilsesquioxane copolymer 1 wt % (based on resin) of the N-methylnifedipine base generator prepared in Preparation Example 8 was added to the methylsilsesquioxane-dimethylsiloxane-phenylsilsesquioxane copolymer prepared in Preparation Example 5, and the resulting mixture was dissolved in methyl isobutyl ketone to prepare the 25 wt % solution. This solution was filtered through a filter with a pore size of 0.45 micrometer, spin coated on a silicon wafer, and pre-baked at 80° C. for 1 minute. The coating thickness was 1 micron. A photomask was overlaid followed by UV irradiation from the 200-W mercury-xenon lamp for 5 seconds. The silicon wafer was then post-baked at 100° C. for 5 minutes, washed with methyl isobutyl ketone, and dried, with the result that a resin pattern corresponding to a negative of the photomask was obtained. The unexposed regions were entirely free of residual resin. It was determined that a resolution of 14 microns had been obtained.

EXAMPLE 5
Photocure of phenylsilsesquioxane polymer 1 wt % (based on resin) of the N-methylnifedipine base generator prepared in Preparation Example 8 was added to the high-silanol phenylsilsesquioxane polymer prepared in Preparation Example 6, and the resulting mixture was dissolved in methyl isobutyl ketone to prepare the 25 wt % solution. This solution was filtered through a filter with a pore size of 0.45 micrometer, spin coated on a silicon wafer, and pre-baked at 80° C. for 1 minute. The coating thickness was 1 micron. A photomask was overlaid followed by UV irradiation from the 200-W mercuryxenon lamp for 0.5 second. The silicon wafer was then post-baked at 150° C. for 1 minute, washed with methyl isobutyl ketone, and dried, with the result that a resin pattern corresponding to a negative of the photomask was obtained. The unexposed regions were entirely free of residual resin. It was determined that a resolution of 5 microns had been obtained.

What is claimed is:

1. An ultraviolet-curable composition comprising
   (a) 0.01 to 20% based on the total weight of the said composition of a N-substituted 4-(o-nitrophenyl) dihydropyridine and
   (b) a silanol-functional polymer of the formula

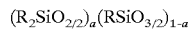

$(R_2SiO_{2/2})_a(RSiO_{3/2})_{1-a}$ wherein a is a number with a value from 0 to 0.5, inclusive and each R is independently selected from the group consisting essentially of $C_1$ to $C_8$ saturated and unsaturated hydrocarbyl groups that may contain at least one atom selected from oxygen, nitrogen, chlorine, silicon, and fluorine;
   wherein at least one of the divalent oxygen atoms bonded to silicon in each $R_2SiO_{2/2}$ is bonded to another silicon to form a siloxane bond while the remaining oxygen may be bonded to another silicon to form a siloxane bond, or may be bonded to methyl or ethyl to form an alkoxy group, or may be bonded to hydrogen to form silanol; at least one of the divalent oxygen atoms bonded to silicon in each $RSiO_{3/2}$ is bonded to another silicon to form a siloxane bond while the remaining oxygen may be bonded to another silicon to form a siloxane bond, or may be bonded to methyl or ethyl to form an alkoxy group, or may be bonded to hydrogen to form silanol; with the proviso that $RSiO_{3/2}$ having at least one silanol accounts for at least 10 moles % of the total silicon in the polymer molecule.

2. The ultraviolet-curable composition as claimed in claim 1, wherein the silanol-functional polymer (b) is a polymer of the formula $(RSiO_{3/2})$ wherein R is selected from the group consisting essentially of methyl, ethyl, propyl, 3,3,3-trifluoropropyl, n-butyl, n-hexyl, n-octyl, vinyl, allyl, and 5-hexenyl; and $RSiO_{3/2}$ having at least one silanol accounts for at least 10 mole % of the total silicon in the polymer.

3. The ultraviolet-curable composition as claimed in claim 1, wherein the silanol-functional polymer (b) is a polymer having the formula $(RSiO_{3/2})$ wherein R is selected from the group consisting essentially of isopropyl, phenyl, m-tolyl, and p-tolyl; and $RSiO_{3/2}$ having at least one silanol accounts for at least 40 mole % of the total silicon in the polymer molecule.

4. The ultraviolet-curable composition as claimed in claim 1, wherein the silanol-functional polymer (b) is a polymer of the formula $(R_2SiO_{2/2})_a(RSiO_{3/2})_{1-a}$ wherein a is a number with a value from 0.2 to 0.5; wherein each R is independently selected from the group consisting essentially of phenyl and methyl; and $RSiO_{3/2}$ carrying at least one silanol accounts for at least 15 mole % of the total silicon in the polymer molecule.

5. The ultraviolet-curable composition as claimed in claim 1 wherein the N-substituted 4-(o-nitrophenyl) dihydropyridine is selected from 4-(o-nitrophenyl) dihydropyridines in which the group bonded at position 1 on the dihydropyridine is selected from methyl, ethyl, n-propyl, n-butyl, allyl, 3-butenyl, or benzyl; the group bonded at position 3 and position 5 on the dihydropyridine is selected from methoxycarbonyl or ethoxycarbonyl; and the group bonded at position 2 and position 6 on the dihydropyridine is selected from methyl or ethyl.

6. The ultraviolet-curable composition as claimed in claim 1 wherein the N-substituted 4-(o-nitrophenyl) dihydropyridine is present in an amount of 0.1 to 10 wt % relative to the total weight of the curable composition.

7. A method for the formation of a cured product comprising:
(a) forming a coating of the curable composition as claimed in claim 1 on a substrate;
(b) exposing the coating to ultraviolet radiation at a temperature from 0° C. to 100° C.; and
(c) thereafter heating said coating at a temperature of from 100° C. to 400° C.

8. The method as claimed in claim 7 wherein the coating is formed by applying the composition as claimed in claim 2 to the substrate.

9. The method as claimed in claim 7 wherein the coating is formed by applying the composition as claimed in claim 3 to the substrate.

10. The method as claimed in claim 7 wherein the coating is formed by applying the composition as claimed in claim 4 to the substrate.

11. A method for forming a cured pattern corresponding to the negative of a photomask comprising:
(a) forming a coating of the curable composition as claimed in claim 1 on a substrate;
(b) placing a masking pattern between the curable composition and an ultraviolet source;
(c) exposing the coating to ultraviolet radiation across a masking pattern at a temperature from 0° C. to 100° C.;
(d) heating the coating at a temperature of 0° C. to 250° C.; and
(e) dissolving and removing any uncured curable composition by contacting the coating with a solvent thereby generating a pattern of cured product.

12. The method as claimed in claim 11 wherein the pattern of cured product is heated 50° C. to 400° C.

* * * * *